(12) United States Patent
Park

(10) Patent No.: US 10,902,928 B2
(45) Date of Patent: Jan. 26, 2021

(54) MEMORY SYSTEM, OPERATION METHOD THEREOF, AND NONVOLATILE MEMORY DEVICE

(71) Applicant: SK hynix Inc., Gyeonggi-do (KR)

(72) Inventor: Se Chang Park, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/380,510

(22) Filed: Apr. 10, 2019

(65) Prior Publication Data

US 2020/0098439 A1 Mar. 26, 2020

(30) Foreign Application Priority Data

Sep. 21, 2018 (KR) .................. 10-2018-0113636

(51) Int. Cl.
| | | |
|---|---|---|
| *G11C 16/04* | (2006.01) | |
| *G11C 16/34* | (2006.01) | |
| *G11C 11/56* | (2006.01) | |
| *G11C 16/16* | (2006.01) | |
| *G11C 16/26* | (2006.01) | |

(52) U.S. Cl.
CPC ...... *G11C 16/3477* (2013.01); *G11C 11/5635* (2013.01); *G11C 16/16* (2013.01); *G11C 16/26* (2013.01)

(58) Field of Classification Search
CPC . G11C 11/5635; G11C 16/3477; G11C 16/16; G11C 16/26
See application file for complete search history.

(56) References Cited

U.S. PATENT DOCUMENTS

| | | | | |
|---|---|---|---|---|
| 2012/0014179 A1* | 1/2012 | Choy | ................ | G11C 16/0483 365/185.3 |
| 2013/0163324 A1* | 6/2013 | Noh | ................... | G11C 16/0483 365/185.02 |
| 2014/0297924 A1* | 10/2014 | Sanda | ................ | G11C 11/5635 711/103 |

FOREIGN PATENT DOCUMENTS

KR 1020160039018 4/2016

* cited by examiner

*Primary Examiner* — Uyen Smet
(74) *Attorney, Agent, or Firm* — IP & T Group LLP

(57) ABSTRACT

A memory system may include a memory cell array including a plurality of memory blocks; a peripheral circuit configured to apply a check voltage for acquiring check data to a target memory block and apply program voltages to the target memory block in a pre-program operation for the target memory block; and a controller configured to control the peripheral circuit, determine status information on the target memory block based on the check data, and variably apply a program start voltage to the target memory block based on the status information in the pre-program operation.

15 Claims, 9 Drawing Sheets

○ : PROGRAMMED MEMORY CELL
☐ : EMPTY MEMORY CELL

FIG.5A
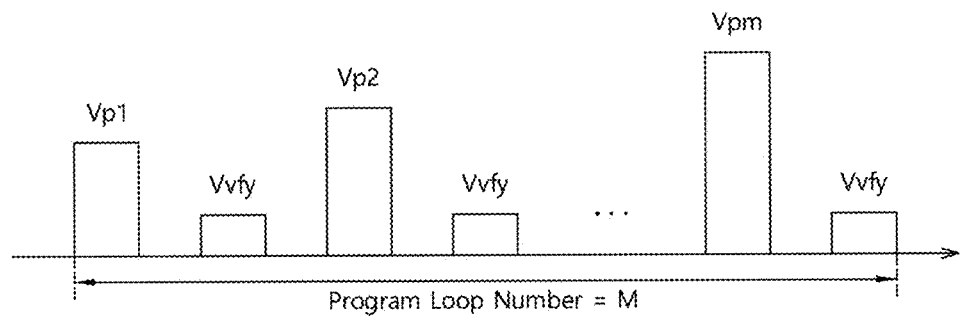
FIG.5B
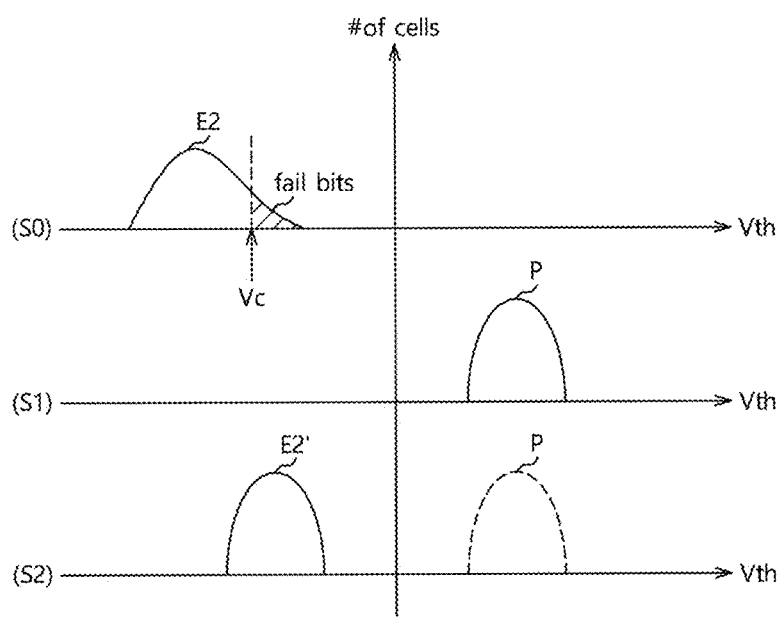
FIG.5C
<PROGRAM START VOLTAGE TABLE>
| FAIL BIT RATE (%) | PROGRAM START VOLTAGE |
|---|---|
| 0 ~ 3 | 11V |
| 3 ~ 6 | 9V |
| 6 ~ 9 | 7V |
| 9 ~ | 5V |

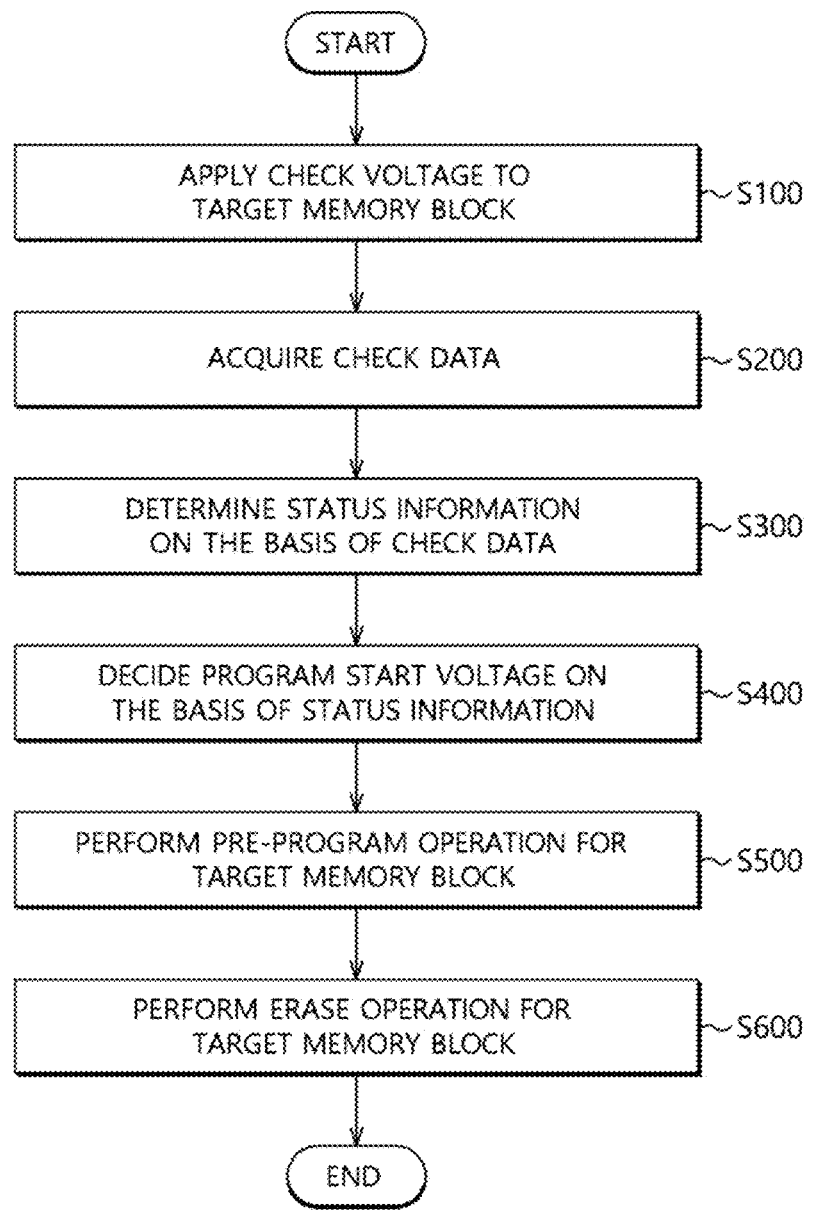

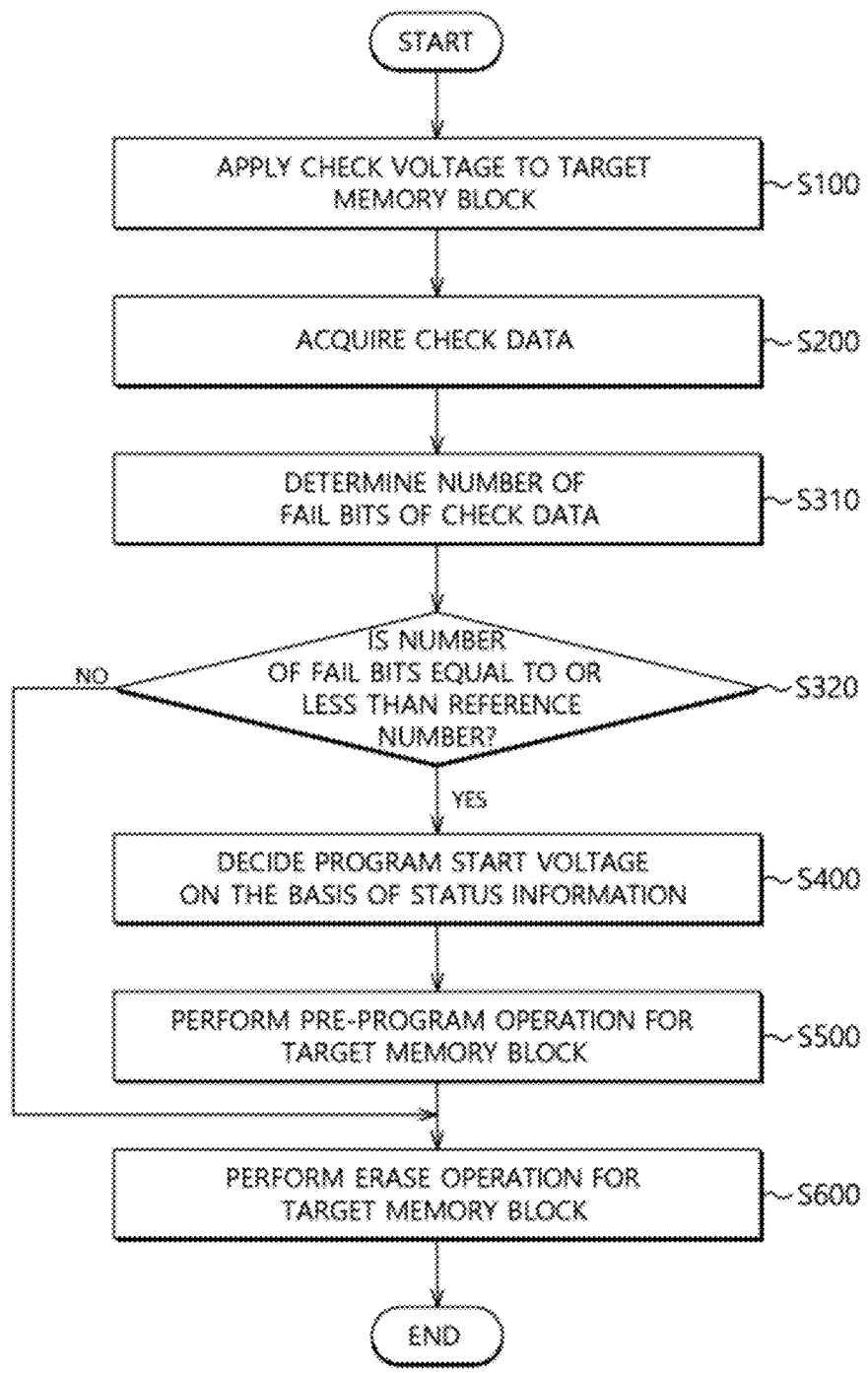

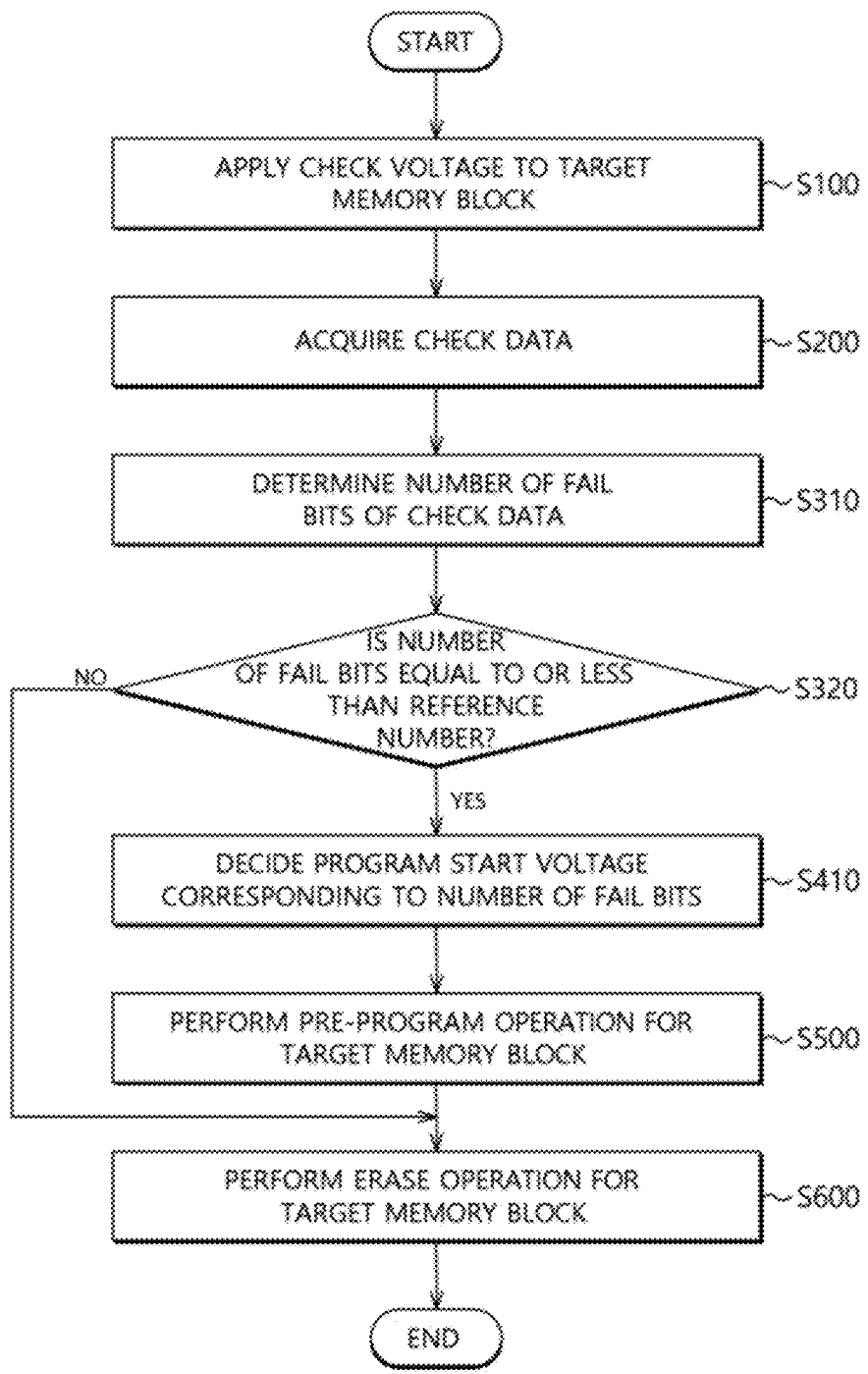

MEMORY SYSTEM, OPERATION METHOD THEREOF, AND NONVOLATILE MEMORY DEVICE

CROSS-REFERENCES TO RELATED APPLICATION

The present application claims priority under 35 U.S.C. § 119(a) to Korean application number 10-2018-0113636, filed on Sep. 21, 2018, in the Korean Intellectual Property Office, which is incorporated herein by reference in its entirety.

BACKGROUND

1. Technical Field

Various embodiments of the present invention generally relate to a memory system. Particularly, embodiments relate to a memory system including a nonvolatile memory device.

2. Related Art

A memory system may be configured to store data provided from an external device, in response to a write request of the external device. Furthermore, the memory system may be configured to provide the stored data to the external device in response to a read request of the external device. The external device is an electronic device capable of processing data and may include a computer, a digital camera, a cellular phone and the like. The memory system may be embedded in the external device, or may be fabricated in a separable form to be electrically connected to the external device.

Since there is no mechanical driving unit, the memory system using such a memory device has advantages such as excellent stability and endurance, high information access speed, and low power consumption. The memory system having such an advantage includes a universal serial bus (USB) memory device, a memory card having various interfaces, a universal flash storage (UFS) device, and a solid state drive (hereinafter, referred to as SSD).

SUMMARY

In an embodiment, a memory system may include: a memory cell array including a plurality of memory blocks; a peripheral circuit configured to apply a check voltage for acquiring check data to a target memory block and apply program voltages to the target memory block in a pre-program operation for the target memory block; and a controller configured to control the peripheral circuit, determine status information on the target memory block based on the check data, and variably apply a program start voltage to the target memory block based on the status information in the pre-program operation.

In an embodiment, an operation method of a memory system that performs a pre-program operation for a target memory block may include: applying a check voltage to a word line included in a target memory block; acquiring check data from the target memory block; determining status information on the target memory block based on the check data; deciding a program start voltage based on the status information; and performing the pre-program operation by applying the decided program start voltage to the target memory block.

In an embodiment, a nonvolatile memory device may include: a memory cell array including a plurality of memory blocks; a voltage generation circuit configured to generate voltages to be applied to the memory cell array in response to an operation signal; and a control logic configured to control the voltage generation circuit such that check data is acquired by applying a check voltage to a target memory block selected from the memory blocks and program voltages are applied to the target memory block in a pre-program operation for the target memory block, wherein the control logic controls the voltage generation circuit such that status information is determined based on the check data and a program start voltage to be applied to the target memory block is variably applied in the pre-program operation based on the status information.

In an embodiment, a memory device may include: a memory block; a peripheral circuit configured to perform an operation to the memory block; and a control logic configured to: detect a number of failed bits within data read from the memory block according to a predetermined read voltage for erased memory cells within the memory block; control the peripheral circuit to perform a pre-program operation to the memory block according to an incremental step pulse program (ISPP) scheme with an initial program voltage based on the number of failed bits; and control the peripheral circuit to perform an erased operation to the memory block, wherein the initial program voltage becomes lower as the number of failed bits becomes greater.

BRIEF DESCRIPTION OF THE DRAWINGS

FIG. 5A is a diagram illustrating an example of a program loop according to an ISPP scheme.

FIG. 5B is a diagram illustrating a threshold voltage distribution for explaining a change in a voltage distribution when a pre-program operation is performed for a deeply erased memory cell in accordance with an embodiment.

FIG. 5C is a table for explaining an embodiment in which a program start voltage of a pre-program is variably applied according to a fail bit rate.

FIG. 6 to FIG. 8 are flowcharts for explaining an operation method of a memory system in accordance with an embodiment.

DETAILED DESCRIPTION

Figure 1:
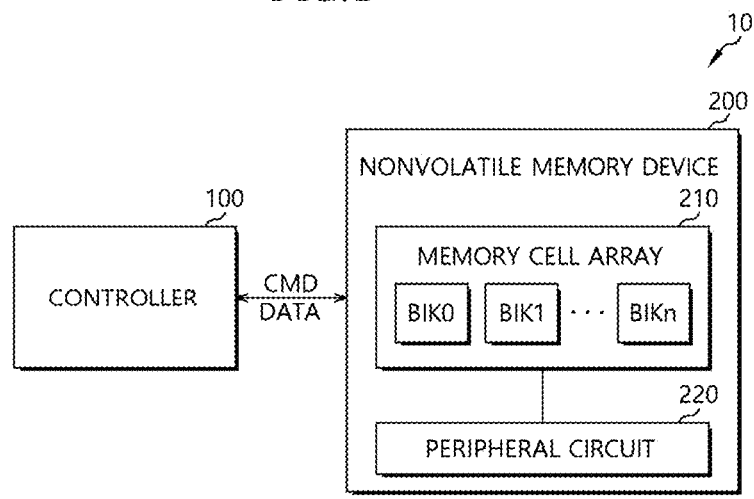
FIG. 1 is a block diagram schematically illustrating a configuration of a memory system in accordance with an embodiment.

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

The terminology used herein is for the purpose of describing particular embodiments only and is not intended to be limiting of the present invention.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, a memory system, an operation method thereof, and a nonvolatile memory device will be described below with reference to the accompanying drawings through various examples of embodiments.

FIG. 1 is a block diagram schematically illustrating a configuration of a memory system 10 in accordance with an embodiment.

The memory system 10 may store data which is accessed by a host device such as a cellular phone, a MP3 player, a laptop computer, a desktop computer, a game machine, a television, an in-vehicle infotainment system.

The memory system 10 may be fabricated as any one of various types of storage devices according to a host interface indicating a transfer protocol with the host device. For example, the memory system 10 may be configured as any one of various types of storage devices such as a multimedia card in the form of a SSD, a MMC, an eMMC, a RS-MMC, or a micro-MMC, a secure digital card in the form of a SD, a mini-SD, or a micro-SD, a universal serial bus (USB) storage device, a universal flash storage (UFS) device, a storage device in the form of a personal computer memory card international association (PCMCIA) card, a storage device in the form of a peripheral component interconnection (PCI) card, a storage device in the form of a PCI express (PCI-e or PCIe) card, a compact flash (CF) card, a smart media card, and a memory stick.

The memory system 10 may be fabricated as any one of various types of packages. For example, the memory system 10 may be fabricated as any one of various types of packages such as a package on package (POP), a system in package (SIP), a system on chip (SOC), a multi-chip package (MCP), a chip on board (COB), a wafer-level fabricated package (WFP), and a wafer-level stack package (WSP).

The memory system 10 may include a controller 100 and a nonvolatile memory device 200.

The controller 100 may generally control an operation of the nonvolatile memory device 200, and may apply a command CMD and data DATA to the nonvolatile memory device 200 or receive the data DATA from the nonvolatile memory device 200 in response to a host request received from a host device (not illustrated).

Although not illustrated in the drawings, the host device may communicate with the memory system 10 by using an interface protocol such as a peripheral component interconnect-express (PCI-e or PCIe), an advanced technology attachment (ATA), a serial ATA (SATA), a parallel ATA (DATA), and a serial attached SCSI (SAS).

The nonvolatile memory device 200 may be configured as any one of various types of nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) film, a phase change random access memory (PCRAM) using chalcogenide alloys, and a resistive random access memory (RERAM) using a transition metal oxide.

The nonvolatile memory device 200 may include a memory cell array 210. Memory cells included in the memory cell array 210 may be configured in units of hierarchical memory cell sets or memory cells in an operational aspect or a physical (or structural) aspect. For example, memory cells electrically connected to substantially the same word line and simultaneously read and written (or programmed) may be called a "page". Furthermore, memory cells simultaneously deleted may be called a memory "block". The memory cell array 210 may include a plurality of memory blocks Blk0 to Blkn, wherein each of the memory blocks Blk0 to Blkn may include a plurality of pages.

The nonvolatile memory device 200 may perform a program, read, or erase operation in response to the command CMD and the data DATA received from the controller 100.

The nonvolatile memory device 200 may include a peripheral circuit 220. A configuration and a function of the peripheral circuit 220 will be described later with reference to FIG. 2.

Figure 2:
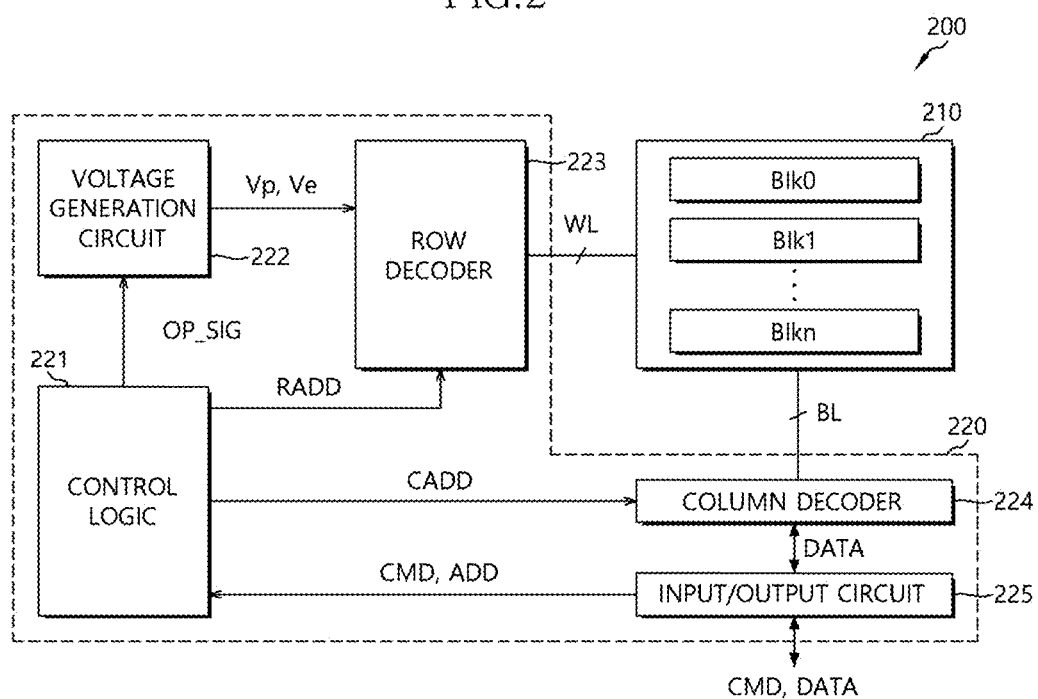
FIG. 2 is a diagram for illustrating a configuration of a nonvolatile memory device of FIG. 1.

FIG. 2 is a diagram illustrating the configuration of the nonvolatile memory device of FIG. 1.

Referring to FIG. 1 and FIG. 2, the nonvolatile memory device 200 in accordance with an embodiment may include the memory cell array 210 and the peripheral circuit 220.

The nonvolatile memory device 200 may include the memory cell array 210 that stores data, and the peripheral circuit 220 configured to program data in the memory cell array 210, read the data stored in the memory cell array 210, or erase the data of the memory cell array 210.

The memory cell array 210 may include memory cells disposed in an area where word lines WL and bit lines BL cross each other.

The memory cell array 210 may include the plurality of memory blocks BIk0 to Blkn. The word lines WL and the bit lines BL may be electrically connected to the respective memory blocks BIk0 to Blkn. The word lines WL are electrically connected to the respective memory blocks BIk0 to Blkn, and the bit lines BL are commonly connected to the memory blocks BIk0 to Blkn. The memory blocks BIk0 to Blkn may include cell strings having a two-dimensional or three-dimensional structure. The cell strings include a plurality of memory cells, wherein in the cell strings having a two-dimensional structure, memory cells are disposed in parallel to a substrate and in the cell strings having a three-dimensional structure, memory cells are stacked vertically to the substrate.

In accordance with an embodiment, the peripheral circuit 220 may include a voltage generation circuit 222 configured to generate a program voltage Vp and an erase voltage Ve in response to an operation signal OP_SIG, a row decoder 223 configured to transfer the voltages generated in the voltage generation circuit 222 to selected word lines and non-selected word lines in response to a row address RADD, a column decoder 224 configured to exchange the data DATA through the bit lines BL electrically connected to the memory cell array 210 in response to a column address CADD, a control logic 221 configured to control the peripheral circuit 220 under the control of the controller 100, and an input/output circuit 225 configured to receive the command CMD from the controller 100, transfer the command CMD to the control logic 221, and exchange the data DATA with the controller 100.

The control logic 221 may control the general operation of the nonvolatile memory device 200 on the basis of a control signal provided from an external device. For example, the control logic 221 may control the read, program, and erase operations of the nonvolatile memory device 200.

The control logic 221 may control the peripheral circuit 220 by outputting the operation signal OP_SIG, the row address RADD, and the column address CADD in response to the command CMD and an address ADD. In the program operation, the control logic 221 may control the peripheral circuit 220 such that the program voltage Vp is applied to a selected word line (or a selected memory cell). Particularly, in a pre-program operation for a target memory block, the control logic 221 may control the peripheral circuit 220 such that the level of a program start voltage is adjusted according to status information (for example, the number of fail bits detected) on the target memory block. For example, in the pre-program operation, when there is an increase in the number of fail bits of a memory block (hereinafter, a target memory block) of the pre-program operation, the control logic 221 may control the level of a pre-program voltage to be reduced. The pre-program operation will be described in detail with reference to FIG. 5A and FIG. 5B. In the cell string, a source region may indicate a region to which a source line is electrically connected and a drain region may indicate a region to which a bit line is electrically connected. Furthermore, the control logic 221 may control the peripheral circuit 220 such that in the cell string divided into the source region and the drain region, substantially the same pass voltage or pass voltages different from each other are applied to all non-selected word lines according to an area including a selected word line.

The voltage generation circuit 222 may generate voltages to be used in an internal operation of the nonvolatile memory device 200. The voltages generated by the voltage generation circuit 222 may be applied to the memory cells of the memory cell array 210. For example, the program voltage Vp generated in the program operation may be applied to the word lines of memory cells of the program operation. In another example, the erase voltage Ve generated in the erase operation may be applied to well regions of memory cells of the erase operation. In another example, the read voltage generated in the read operation may be applied to the word lines of memory cells of the read operation.

The voltage generation circuit 222 generates various levels of operation voltages Vp and Ve to be used for the program and erase operations in response to the operation signal OP_SIG. The program operation will be described below as an example. The voltage generation circuit 222 may generate the program voltage Vp and a pass voltage (not illustrated), and may also generate various levels of other voltages.

The row decoder 223 may be electrically connected to the memory cell array 210 through the word lines WL. The row decoder 223 may operate under the control of the control logic 221. The row decoder 223 may decode an address provided from the external device. On the basis of the decoding result, the row decoder 223 may select and drive word lines WL. For example, the row decoder 223 may provide the word lines WL with a word line voltage provided from the voltage generation circuit 222. The row decoder 223 may transfer operation voltages to word lines WL electrically connected to a selected memory block in response to the row address RADD.

The column decoder 224 may operate under the control of the control logic 221. The column decoder 224 may decode an address provided from the external device. On the basis of the decoding result, the column decoder 224 may electrically connect read/write circuits of a data read/write block (not illustrated) corresponding to each bit line BL to a data input/output line (or a data input/output buffer). The column decoder 224 may exchange data with a memory block selected through the bit lines BL in response to the column address CADD.

The input/output circuit 225 may receive the command CMD and the data DATA from the controller 100, transmit the command CMD and the address ADD to the control logic 221, and exchange the data DATA with the column decoder 224. The address ADD may be included in the data DATA received in the input/output circuit 225.

Although not illustrated in the drawing, the peripheral circuit 220 may include the data read/write block. The data read/write block may be electrically connected to the memory cell array 210 through the bit lines BL. The data read/write block may include the read/write circuits (not illustrated) respectively corresponding to the bit lines BL. The data read/write block may operate under the control of the control logic 221. The data read/write block may serve as a write driver or a sense amplifier according to an operation mode. For example, the data read/write block may serve as a write driver that stores data provided from the external device in the memory cell array 210 in the write operation. In another example, the data read/write block may serve as a sense amplifier that reads data from the memory cell array 210 in the read operation.

The nonvolatile memory device 200 in accordance with an embodiment may include the memory cell array 210 including the plurality of memory blocks Blk0 to Blkn, the voltage generation circuit 222 configured to generate voltages to be applied to the memory cell array 210 in response to the operation signal, and the control logic 221 that acquires check data by applying a check voltage to a target memory block selected from the memory blocks Blk0 to Blkn and controls the voltage generation circuit 222 to apply program voltages to the target memory block in the pre-program operation for the target memory block.

The control logic 221 may determine status information on the basis of the check data in the pre-program operation and control the voltage generation circuit 222 to variably apply a program start voltage to be applied to the target memory block in the pre-program operation on the basis of the status information.

In accordance with an embodiment, the nonvolatile memory device 200 may further include the row decoder 223 configured to transfer the check voltage and the program voltages generated in the voltage generation circuit 222 to word lines included in the target memory block in response to the row address, the column decoder 224 configured to exchange data through the bit lines electrically connected to the memory cell array 210 in response to the column address, and the input/output circuit 225 configured to transmit/receive a command and data from an exterior.

In accordance with an embodiment, the control logic 221 may control the voltage generation circuit 222 to generate a plurality of check voltages having levels different from one another, may determine status information on the basis of a plurality of pieces of check data acquired by applying the plurality of check voltages to the target memory block, and may determine the status information on the basis of the number of fail bits included in the check data.

The control logic 221 may control the pre-program operation to be performed when the number of fail bits is equal to or less than a preset reference number, and may control the voltage generation circuit 222 to generate the program start voltage having a reduced level when the number of fail bits increases.

The control logic 221 may apply the check voltage to a word line selected from a plurality of word lines included in the target memory block, and determine the status information on the basis of check data acquired from the selected word line.

Figure 3:
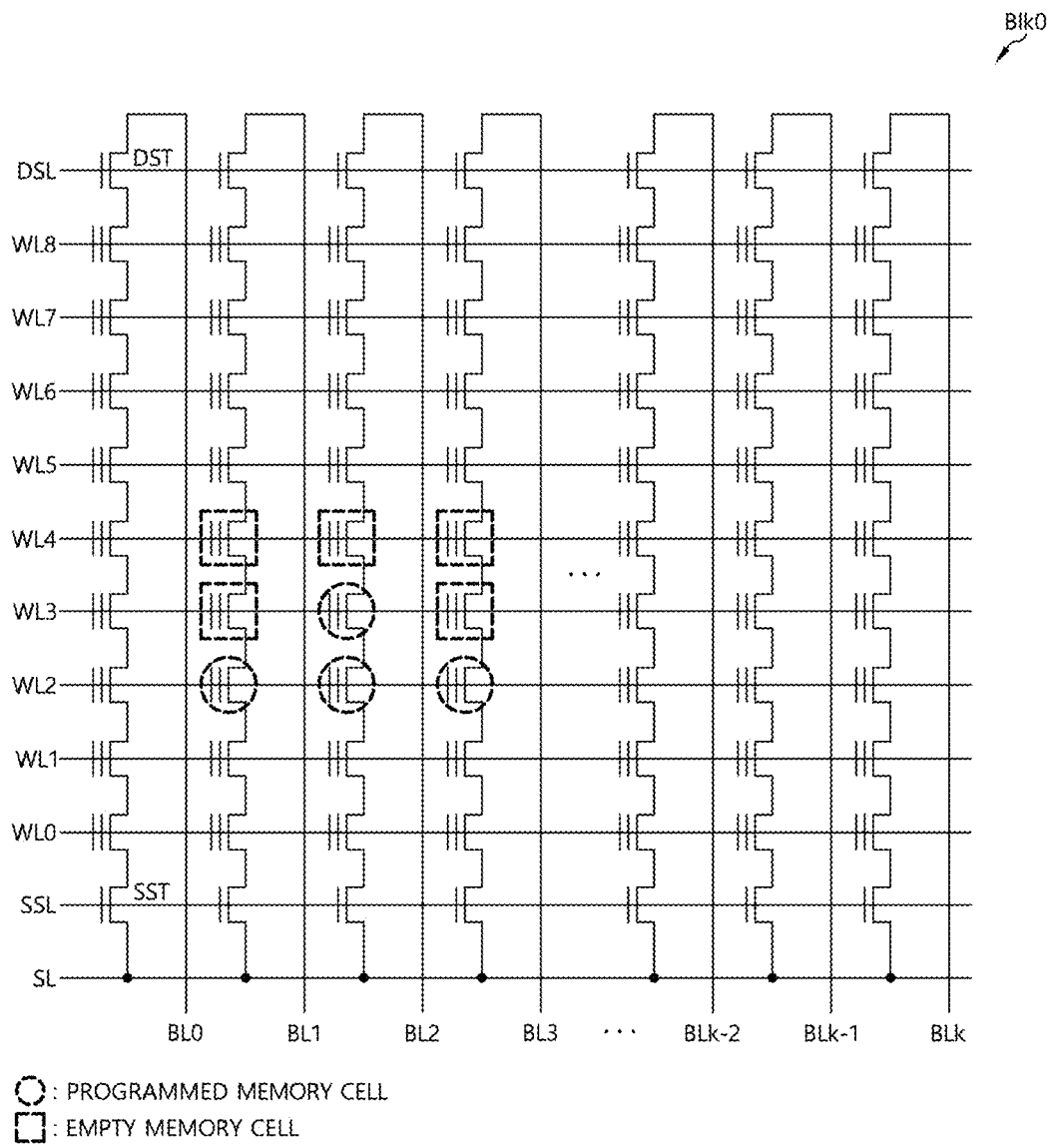
FIG. 3 is a detailed circuit diagram for illustrating a memory block of FIG. 2.
Figure 4:
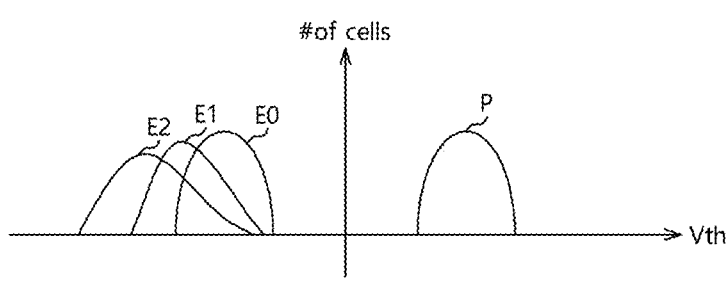
FIG. 4 is a diagram illustrating a threshold voltage distribution for explaining a change in a voltage distribution when deep erase occurs.

FIG. 3 is a detailed circuit diagram for illustrating the memory block of FIG. 2, and FIG. 4 is a diagram illustrating a threshold voltage distribution for explaining a change in a voltage distribution when deep erase occurs. For the purpose of convenience, the memory block Blk0 of FIG. 1 will be described as an example. Hereinafter, with reference to FIG. 3 and FIG. 4, a description will be provided for problems occurring when a specific memory cell is affected by adjacent memory cells.

Referring to FIG. 3, the memory block Blk0 includes a plurality of strings electrically connected between bit lines BL0 to BLk and a source line SL.

The string includes source select transistors (SST), memory cells, and drain select transistors (DST) connected in series between the source line SL and the bit line BL0. A gate of the source select transistor (SST) is electrically connected to a source select line (SSL), gates of the memory cells are electrically connected to word lines WL0 to WL8, and a gate of the drain select transistor (DST) is electrically connected to a drain select line (DSL). A group of memory cells electrically connected to strings different from one another is called a page. The number of source select transistors (SST), the number of memory cells, and the number of drain select transistors (DST) may differ according to a nonvolatile memory device.

A memory cell array includes a plurality of cell strings disposed on a substrate in row and column directions. Each cell string includes a plurality of memory cells stacked in a direction perpendicular to the substrate. That is, the memory cells may be provided along rows and columns on the substrate and may be stacked in the direction perpendicular to the substrate, thereby forming a three-dimensional structure.

In the program operation, when the program voltage Vp is applied to a selected word line to which memory cells to be programmed are electrically connected, a pass voltage (not illustrated) is applied to other non-selected word lines. The pass voltage may be set to a positive voltage higher than 0 V.

As illustrated in the drawings, the memory cells included in the memory block BLk0 may be in a program state in which data has been stored or an empty state in which data has not been stored. Hereinafter, a memory cell electrically connected to an intersection point of a $x^{th}$ bit line BLx and a $y^{th}$ word line WLy is called a "memory cell (x, y)". Furthermore, a description will be provided for an influence among nine of the memory cells included in the memory block BLk0 according to the program or the empty state thereof. It is assumed that a memory cell (1, 2), a memory cell (2, 2), a memory cell (2, 3), and a memory cell (2, 3) are in the program state in which data has been stored, and a memory cell (1, 3), a memory cell (1, 4), a memory cell (2, 4), a memory cell (3, 3), and a memory cell (3, 4) are in the empty state in which data has not been stored.

Referring to FIG. 4, a threshold voltage distribution of the memory cells included in the memory block of the nonvolatile memory device may change as the number of times by which the memory cells are used. Specifically, when an erased-status-voltage distribution in a state, in which data has not been stored once, is defined as an erased-status-voltage distribution E0, a lower level of voltage distribution may be formed according to an increase in the number of times by which program/erase operations of a corresponding memory cell have been performed. For example, as the number of times of program/erase increases, a threshold voltage distribution of an erased memory cell may move to sequentially have the erased-status-voltage distribution E0, an erased-status-voltage distribution E1, and an erased-status-voltage distribution E2. As described above, when the erased-status-voltage distribution moves to a lower level as the usage or the number of times of program/erase of the memory cell increases, it is called a deep erase phenomenon. The memory cell of the deep erase phenomenon is referred to as a "deeply erased memory cell" in this disclosure.

In a case of a memory cell array having the three-dimensional structure, a memory cell, in which the deep erase has occurred, causes a retention phenomenon of a program voltage distribution of adjacent memory cells. That is, when the deeply erased memory cell is positioned adjacent to a memory cell having a program voltage distribution P, the program voltage distribution P may become more distributed to have lower level and thus the error probability increases in the program operation on the adjacent memory cell to have the deformed program voltage distribution P and it is highly probable that uncorrectable error correction code (UECC) will occur in the read operation on the adjacent memory cell having the deformed program voltage distribution P.

For example, it is assumed that a voltage distribution of erase cells illustrated in FIG. 3, that is, the memory cell (1, 3), the memory cell (1, 4), the memory cell (2, 4), the memory cell (3, 3), and the memory cell (3, 4) is the erased-status-voltage distribution E2. The memory cell (2, 3) of programmed memory cells will be described as a reference. The memory cell (2, 3) may be affected by the memory cell (2, 4) which is an error memory cell electrically connected to an adjacent word line among memory cells positioned at substantially the same bit line. Furthermore, the memory cell (2, 3) may be affected by the memory cell (1, 3) and the memory cell (3, 3) electrically connected to an adjacent bit line among memory cells positioned at substantially the same word line. As described above, in the program voltage distribution of the memory cell (2, 3), which is the programmed memory cell, since the retention phenomenon may occur due to an influence of adjacent memory cells, that is, the memory cell (1, 3), the memory cell (2, 4), and the memory cell (3, 3) in which the deep erase has occurred, the reliability of the system may be problematic.

FIG. 5A is a diagram illustrating an example of a program loop according to an ISPP scheme, FIG. 5B is a diagram illustrating a threshold voltage distribution for explaining a change in a voltage distribution when the pre-program operation is performed for a deeply erased memory cell in accordance with an embodiment, and FIG. 5C is a table for explaining an embodiment in which the program start voltage of a pre-program is variably applied according to a fail bit rate. Hereinafter, with reference to FIG. 1 and FIG. 5A to FIG. 5C, a description will be provided for an operation in which the pre-program operation is performed for the target memory block and the program start voltage applied to the pre-program operation is variable set in accordance with an embodiment. For the purpose of convenience, a single level cell (SLC), in which 1 bit is stored per memory cell, will be described as a reference, but it is of course that the same may also be applied to a multi-level cell (MLC) in which 2 bits or more are stored per memory cell.

As illustrated in FIG. 5A, the program operation may be performed by an incremental step pulse program (ISPP) scheme according to an embodiment. Whenever the program loop increases, program voltages Vp1 to Vpm may increase by a predetermined size, and a program operation using the program voltages Vp1 to Vpm and a verification operation using a verification voltage Vvfy may be performed in one program loop. For example, in a case where a maximum value of a program loop number is set to M, whenever the program loop is executed, the program voltages Vp1 to Vpm may increase from the first program voltage Vp1 to the $m^{th}$ program voltage Vpm.

Although not illustrated in the drawings, the erase operation may also be performed by an incremental step pulse erase (ISPE) scheme according to an embodiment. Whenever an erase loop increases, an erase voltage may increase by a predetermined size, and an erase operation using the erase voltage and a verification operation using a verification voltage may be performed in one erase loop. For example, in a case where a maximum value of an erase loop number is set to N, whenever the erase loop is executed, the erase voltage may increase from a first erase voltage to an nth erase voltage.

In accordance with an embodiment, with an increase in program/erase cycles of the nonvolatile memory device 200, the maximum value M of the program loop number and the maximum value N of the erase loop number may be changed. When the maximum value M of the program loop number increases, data may be written through many more program loops in correspondence to a write request. Furthermore, in program fail determination, the program loop number serving as a reference of pass/fail determination increases.

Referring to FIG. 5B, the memory system 10 in accordance with an embodiment may include the memory cell array 210 including the plurality of memory blocks Blk0 to Blkn, the peripheral circuit 220 that applies a check voltage Vc to a target memory block for acquiring check data and applies program voltages to the target memory block in the pre-program operation for the target memory block, and the controller 100 that is configured to control the peripheral circuit 220, and determines status information on the target memory block on the basis of the check data and variably applies the program start voltage to the target memory block on the basis of the status information in the pre-program operation.

In step S0, in order to acquire check data of a memory block (hereinafter, "target memory block") of the erase operation, the check voltage Vc may be applied to a word line corresponding to a page storing no data among pages included in the target memory block. That is, the threshold voltage distribution illustrated in FIG. 5B is a threshold voltage distribution of memory cells included in the target memory block, and a voltage distribution of erased memory cells electrically connected to the word line corresponding to the page storing no data among the pages included in the target memory block illustrated as an erased-status-voltage distribution E2.

The erased-status-voltage distribution E2 is assumed to form a voltage distribution substantially identical to the erased-status-voltage distribution E2 of FIG. 4. That is, in a case of the erased-status-voltage distribution of the target memory block, the deep erase phenomenon excessively occurs.

In accordance with an embodiment, the check voltage Vc applied to the erased memory cells may be a read voltage applied in order to read programmed data. In accordance with an embodiment, the check voltage Vc may be variably set and be applied. In accordance with an embodiment, a plurality of check voltages Vc having levels different from one another may be applied to the erased memory cells, and on the basis of a plurality of pieces of check data acquired by applying the plurality of check voltages Vc, status information (for example, the number of fail bits or a fail bit rate) may be determined.

In accordance with an embodiment, the number of fail bits of check data acquired by applying the check voltage Vc to the erased memory cells may be determined. For example, check data including "1" bit may be acquired from a memory cell having a voltage lower than the check voltage Vc, and check data including "0" bit may be acquired from a memory cell having a voltage higher than the check voltage Vc. In such a case, check data, which is acquired from a memory cell outputting the "0" bit, that is, the memory cell having a voltage with a level higher than that of the check voltage Vc, may be defined as a fail bit. When there are many memory cells outputting the "0" bit, it is determined that the number of fail bits is large, and the deep erase phenomenon has not occurred or has not excessively occurred in the erased memory cells within the target memory block. In contrast, when the number of fail bits is small, it is determined that the deep erase phenomenon has excessively occurred in the erased memory cells within the target memory block. That is, in accordance with an embodiment, the controller 100 may determine status information on the basis of the number of fail bits included in the check data.

In accordance with an embodiment, when the number of fail bits is equal to or less than a preset reference number, the pre-program operation for the target memory block may be decided to be performed. For example, when check data is acquired by applying the check voltage Vc to the erased memory cells of the target memory block of the erase operation, status information is determined according to the number of fail bits included in the check data, and it is determined that there exist fail bits of the preset reference number or less, the pre-program operation for the target memory block may be started.

In another embodiment, when the rate of fail bits included in the erased memory cells bits is equal to or less than a preset reference rate, the pre-program operation for the target memory block may be decided to be performed. As assumed above, it is determined that the deep erase phenomenon has excessively occurred in the erased to memory cells to have the erased-status-voltage distribution E2 within the target memory block since the number of fail bits is determined to be equal to or less than the preset reference number, the pre-program operation for the target memory block is decided to be performed.

In step S1, the controller 100 in accordance with an embodiment may variably apply the program start voltage for the pre-program operation on the basis of the status information on the target memory block. As described above, the program operation is performed using the ISPP scheme and the program voltage level gradually increases. In accordance with an embodiment, a voltage initially applied among program voltages applied to the program operation may be defined as the program start voltage, and the program start voltage may be variably applied on the basis of the number of fail bits determined by applying the check voltage Vc.

As illustrated in FIG. 5C, the memory system 10 in accordance with an embodiment may store a program start voltage table having program start voltages corresponding to a plurality of fail bit rates. The program start voltage table may be stored in a random access memory of the controller 100 or a specific area of the nonvolatile memory device 200. Referring to FIG. 5C, the program start voltage table may store program start voltages set by fail bits rates to the total number of bits. That is, the number of fail bits to the total number of bits acquired from memory cells, to which the check voltage Vc is applied, may be defined as a rate, and a program start voltage corresponding to the rate may be set. For example, when the fail bit rate to the total number of bits is equal to or less than 3%, the program start voltage may be set to 11 V. When the fail bit rate to the total number of bits is in the range of 3% to 6%, the program start voltage may be set to 9 V, when the fail bit rate to the total number of bits is in the range of 6% to 9%, the program start voltage may be set to 7 V, and when the fail bit rate to the total number of bits is equal to or more than 9%, the program start voltage may be set to 5 V. That is, when the fail bit rate to the acquired total bits increases, the program start voltage may be reduced and applied, since an increase in the fail bit rate indicates that the deep erase phenomenon in the erased memory cells is not excessive, the level of the program start voltage may be reduced and applied.

In accordance with an embodiment, in the program start voltage table, the program start voltages corresponding to a plurality of fail bit numbers may be set. When the number of memory cells, to which the check voltage Vc is applied, is fixed, the number of bits to be acquired by applying the check voltage Vc is also fixed and thus the number of fail bits may be set as an index and program start voltages corresponding to respective indexes may be set.

The program start voltage decided based on the fail bit number (or rate) is applied, so that the pre-program operation for the erased memory cells may be performed. That is, among a plurality of pages included in the target memory block of the erase operation, erased pages may be programmed and the memory cells of those programmed pages may have a program voltage distribution P.

In step S2, the erase operation for the target memory block may be performed. That is, a voltage distribution of all memory cells included in the target memory block may be formed to have the program voltage distribution P through the pre-program operation to the target memory block (see step S1), and the erase operation may be performed by applying an erase voltage to the memory cells in the target memory block. As a consequence, the memory cells included in the target memory block may have an erased-status-voltage distribution E2' and the deep erase phenomenon may not occur. For example, the erased-status-voltage distribution E2' may be identical to the erased-status-voltage distribution E0 of FIG. 4.

As described above, in the memory system 10 in accordance with an embodiment, the pre-program operation is performed, before the erase operation to the target memory block, for empty pages among pages included in the target memory block so that it is possible to substantially prevent the deep erase phenomenon. Specifically, check data is acquired by applying the check voltage Vc to the empty pages of the target memory block and status information on the target memory block is determined on the basis of the check data, so that it is possible to decide whether to perform the pre-program operation to the target memory block according to the determined status information. When the erase operation is performed for the target memory block after the pre-program operation, it is possible to substantially prevent the deep erase phenomenon causing a voltage distribution with a level lower than that of an existing erased-status-voltage distribution, so that it is possible to minimize the retention phenomenon due to an influence of deeply erased memory cells to adjacent memory cells.

In addition, the program start voltage to be applied to the pre-program operation is variably set, so that it is possible to reduce the number of pulses to be applied in the pre-program operation, resulting in the improvement of the performance of the system.

FIG. 6 to FIG. 8 are flowcharts for explaining an operation method of the memory system in accordance with an embodiment.

Referring to FIG. 1 and FIG. 6, an operation method of the memory system 10 in accordance with an embodiment may apply a check voltage to a word line included in a target memory block at step S100, acquire check data from the target memory block at step S200, determine status information on the target memory block on the basis of the check data at step S300, decide a program start voltage to be applied in a pre-program operation on the basis of the status information at step S400, and perform the pre-program operation by applying the decided program start voltage at step S500. In accordance with an embodiment, the operation method may further include a step 600 of performing an erase operation for the target memory block.

In accordance with an embodiment, the step S100, in which the memory system 10 applies the check voltage to the word line included in the target memory block, may include a step of applying a plurality of check voltages having levels different from one another to the word line included in the target memory block. In accordance with an embodiment, the step S300, in which the memory system 10 determines status information on the target memory block on the basis of the check data, may include a step of determining the status information on the basis of a plurality of pieces of check data acquired by applying the plurality of check voltages. In accordance with an embodiment, the operation method may further include a step of selecting a word line, to which the check voltage is to be applied, from a plurality of word lines included in the target memory block, and in such a case, the step S100 of applying the check voltage to the word line included in the target memory block may include a step of applying the check voltage to the selected word line.

Referring to FIG. 1, FIG. 6, and FIG. 7, the step S300, in which the memory system 10 determines the status information on the target memory block on the basis of the check data, may include a step S310 of determining the status information on the basis of the number of fail bits included in the check data. In such a case, the operation method of the memory system 10 in accordance with an embodiment may further include a step S320 of deciding the pre-program operation to be performed when the number of fail bits is equal to or less than a preset reference number. That is, when the number of fail bits is equal to or less than the preset reference number (that is, "YES" at step S320), the process proceeds to step S400 in which the memory system 10 decides the program start voltage on the basis of the status information. When the number of fail bits is greater than the preset reference number (that is, "NO" at step S320), the process proceeds to step S600 in which the memory system 10 performs the erase operation for the target memory block.

Referring to FIG. 1 and FIG. 6 to FIG. 8, the step S400, in which the memory system 10 decides the program start voltage to be applied in the pre-program operation on the basis of the status information, may include a step S410 of deciding the program start voltage corresponding to the number of fail bits with reference to the program start voltage table. That is, when the number of fail bits is equal to or less than the preset reference number (that is, "YES" at step S320), the process proceeds to step S410 in which the memory system decides the program start voltage corresponding to the number of fail bits. When the number of fail bits is greater than the preset reference number (that is, "NO" at step S320), the process proceeds to step S600 in which the memory system 10 performs the erase operation for the target memory block.

Figure 9:
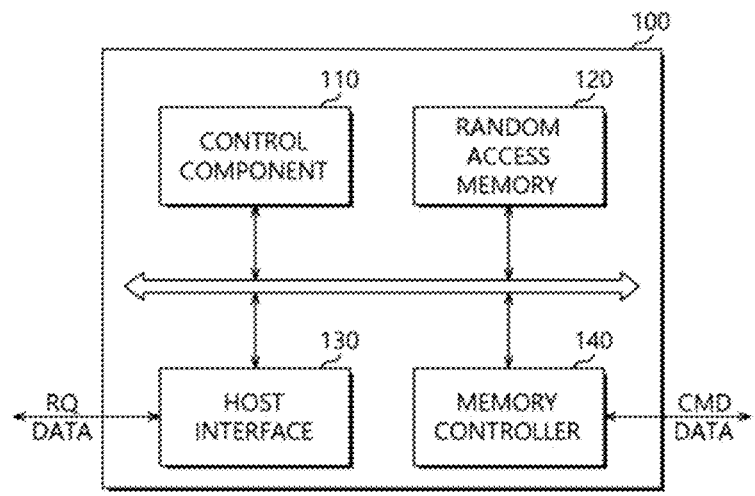
FIG. 9 is a block diagram for explaining a configuration of a controller in accordance with an embodiment.

FIG. 9 is a block diagram for explaining a configuration of the controller in accordance with an embodiment.

Referring to FIG. 1 and FIG. 9, the memory system 10 in accordance with an embodiment may include the controller 100. The controller 100 may include a control component 110, a random access memory 120, a host interface 130, and a memory controller 140.

The control component 110 may include a micro control unit (MCU) and a central processing unit (CPU). The control component 110 may process a request transmitted from the host device. In order to process the request, the control component 110 may execute a code type of instruction or algorithm loaded on the random access memory 120, that is, firmware (FW), and control internal functional blocks and the nonvolatile memory device 200.

The random access memory 120 may include a random access memory such as a dynamic random access memory (DRAM) and a static random access memory (SRAM). The random access memory 120 may store the firmware (FW) to be executed by the control component 110. Furthermore, the random access memory 120 may store data required for executing the firmware (FW), for example, meta data. That is, the random access memory 120 may operate as a working memory of the control component 110. In accordance with an embodiment, the random access memory 120 may store a pass voltage level table in which pass voltage levels matched status information are stored, or a copy block selection reference table in which copy block selection references based on the status information are stored.

The host interface 130 may provide interfacing between the host device (not illustrated) and the memory system 10. For example, the host interface 130 may communicate with the host device by using at least one of standard interface protocols, such as a secure digital, a universal serial bus (USB), a multi-media card (MMC), an embedded MMC (eMMC), a personal computer memory card international association (PCMCIA), a parallel advanced technology attachment (PATA), a serial advanced technology attachment (SATA), a small computer system interface (SCSI), a serial attached SCSI (SAS), a peripheral component interconnection (PCI), a PCI express (PCI-E), and a universal flash storage (UFS), that is, a host interface. As illustrated in the drawing, the host interface 130 may receive a host request RQ from the host device or transmit/receive data DATA.

The memory controller 140 may control a storage medium under the control of the control component 110. The memory controller 140 may be called a memory interface. The memory controller 140 may provide control signals to the nonvolatile memory device 200. The control signals may include a command, an address, a control signal and the like for controlling the nonvolatile memory device 200. The memory controller 140 may provide data to the nonvolatile memory device 200 or receive data from the nonvolatile memory device 200. As illustrated in the drawing, in response to the host request RQ, the memory controller 140 may apply the command CMD and the data DATA to the nonvolatile memory device 200 or receive the data DATA from the nonvolatile memory device 200.

While various embodiments have been described above, it will be understood to those skilled in the art that the embodiments described are examples only. Accordingly, the memory system, the operation method thereof, and the nonvolatile memory device described herein should not be limited based on the described embodiments.

Figure 10:
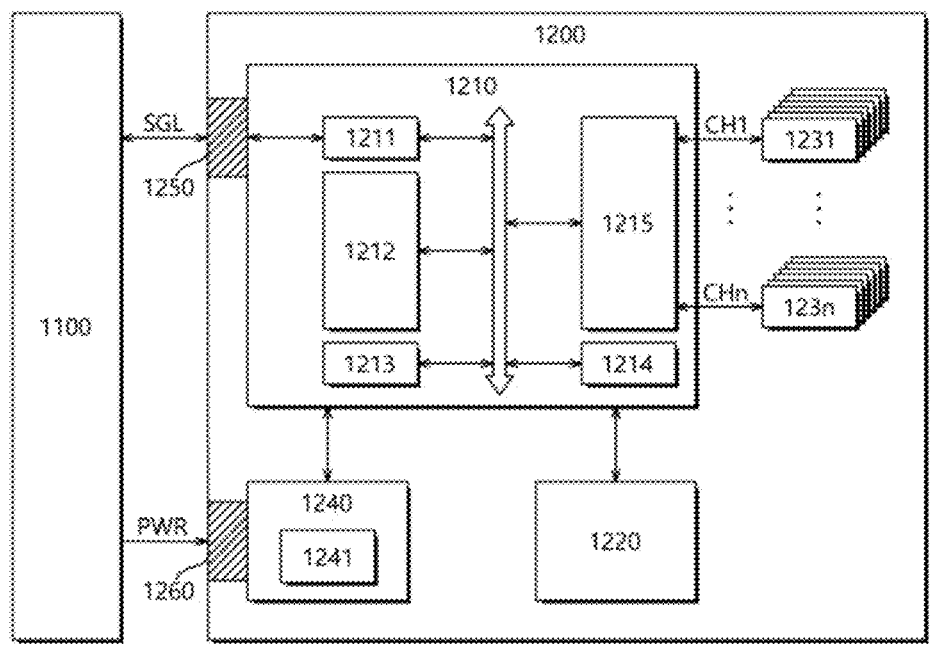
FIG. 10 is a diagram illustrating a data processing system including a solid state drive (SSD) in accordance with an embodiment.

FIG. 10 is a diagram illustrating a data processing system 1000 including a solid state drive (SSD) 1200 in accordance with an embodiment. Referring to FIG. 10, the data processing system 1000 may include a host device 1100 and the SSD 1200.

The SSD 1200 may include a controller 1210, a buffer memory device 1220, a plurality of nonvolatile memory devices 1231 to 123n, a power supply 1240, a signal connector 1250, and a power connector 1260.

The controller 1210 may control general operations of the SSD 1200. The controller 1210 may include a host interface 1211, a control component 1212, a random access memory 1213, an error correction code (ECC) component 1214, and a memory interface 1215.

The host interface 1211 may exchange a signal SGL with the host device 1100 through the signal connector 1250. The signal SGL may include a command, an address, data, and so forth. The host interface 1211 may interface the host device 1100 and the SSD 1200 according to the protocol of the host device 1100. For example, the host interface 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-E) and universal flash storage (UFS).

The control component 1212 may analyze and process the signal SGL received from the host device 1100. The control component 1212 may control operations of internal function blocks according to a firmware or a software for driving the SSD 1200. The random access memory 1213 may be used as a working memory for driving such a firmware or software.

The ECC component 1214 may generate the parity data of data to be transmitted to at least one of the nonvolatile memory devices 1231 to 123n. The generated parity data may be stored together with the data in the nonvolatile memory devices 1231 to 123n. The ECC component 1214 may detect an error of the data read from at least one of the nonvolatile memory devices 1231 to 123n, based on the parity data. If a detected error is within a correctable range, the ECC component 1214 may correct the detected error.

The memory interface 1215 may provide control signals such as commands and addresses to at least one of the nonvolatile memory devices 1231 to 123n, according to control of the control component 1212. Moreover, the memory interface 1215 may exchange data with at least one of the nonvolatile memory devices 1231 to 123n, according to control of the control component 1212. For example, the memory interface 1215 may provide the data stored in the buffer memory device 1220, to at least one of the nonvolatile memory devices 1231 to 123n, or provide the data read from at least one of the nonvolatile memory devices 1231 to 123n, to the buffer memory device 1220.

The buffer memory device 1220 may temporarily store data to be stored in at least one of the nonvolatile memory devices 1231 to 123n. Further, the buffer memory device 1220 may temporarily store the data read from at least one of the nonvolatile memory devices 1231 to 123n. The data temporarily stored in the buffer memory device 1220 may be transmitted to the host device 1100 or at least one of the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 11:
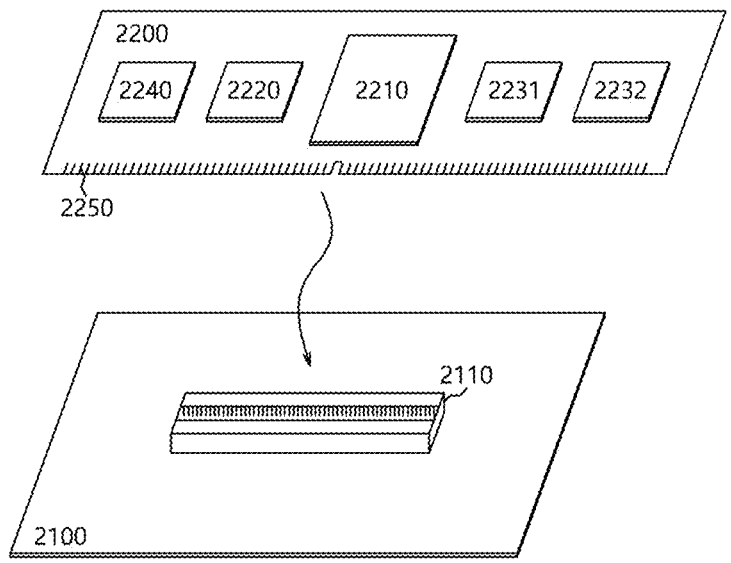
FIG. 11 is a diagram illustrating a data processing system including a memory system in accordance with an embodiment.

FIG. 11 is a diagram illustrating a data processing system 2000 including a memory system 2200 in accordance with an embodiment. Referring to FIG. 11, the data processing system 2000 may include a host device 2100 and the memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control general operations of the memory system 2200. The controller 2210 may be configured in the same manner as the controller 1210 shown in FIG. 10.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the memory system 2200.

The PMIC 2240 may provide the power inputted through the connection terminal 2250, to the inside of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the memory system 2200. The connection terminal 2250 may be configured into various types depending on an interface scheme between the host device 2100 and the memory system 2200. The connection terminal 2250 may be disposed on any one side of the memory system 2200.

Figure 12:
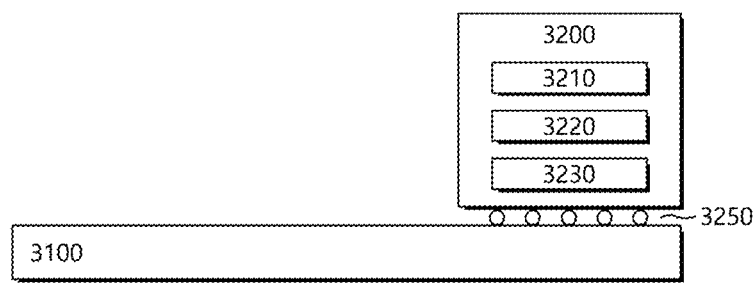
FIG. 12 is a diagram illustrating a data processing system including a memory system in accordance with an embodiment.

FIG. 12 is a diagram illustrating a data processing system 3000 including a memory system 3200 in accordance with an embodiment. Referring to FIG. 12, the data processing system 3000 may include a host device 3100 and the memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control general operations of the memory system 3200. The controller 3210 may be configured in the same manner as the controller 1210 shown in FIG. 10.

The buffer memory device 3220 may temporarily store data to be stored in the nonvolatile memory device 3230. Further, the buffer memory device 3220 may temporarily store the data read from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 13:
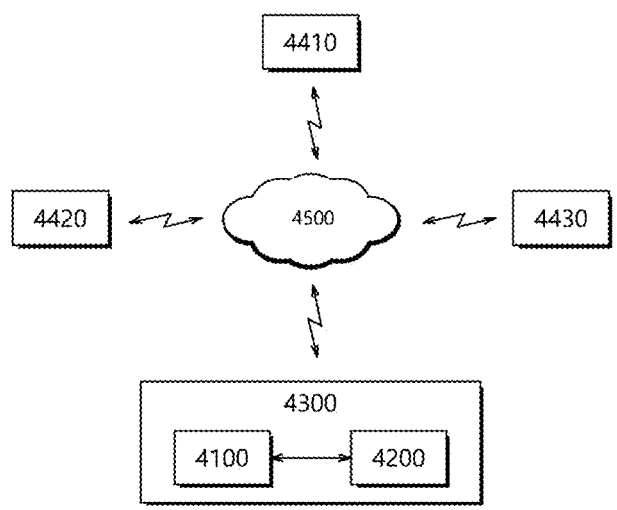
FIG. 13 is a diagram illustrating a network system including a memory system in accordance with an embodiment.

FIG. 13 is a diagram illustrating a network system 4000 including a memory system 4200 in accordance with an embodiment. Referring to FIG. 13, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the memory system 100 shown in FIG. 1, the memory system 1200 shown in FIG. 10, the memory system 2200 shown in FIG. 11 or the memory system 3200 shown in FIG. 12.

What is claimed is:

1. A memory system comprising:
   a memory cell array including a plurality of memory blocks;
   a peripheral circuit configured to apply a check voltage for acquiring check data to a target memory block and apply program voltages to the target memory block in a pre-program operation for the target memory block; and
   a controller configured to control the peripheral circuit, determine status information on the target memory block based on the check data, and variably apply a program start voltage to the target memory block based on the status information in the pre-program operation,
   wherein the controller determines the status information based on a number of fail bits included in the check data, and controls the peripheral circuit such that a level of the program start voltage is reduced and applied when the number of fail bits increases.

2. The memory system according to claim 1, wherein the controller controls the peripheral circuit such that the pre-program operation is performed by an incremental step pulse program (ISPP) scheme in which in which a program voltage gradually increases and a plurality of program loops are performed.

3. The memory system according to claim 1, wherein the controller controls the peripheral circuit such that a plurality of check voltages having levels different from one another are applied to the target memory block, and determines the status information based on a plurality of pieces of check data acquired by applying the plurality of check voltages.

4. The memory system according to claim 1,
   wherein the peripheral circuit applies the check voltage to a word line selected from a plurality of word lines included in the target memory block, and
   wherein the controller determines the status information based on the check data acquired from the selected word line.

5. The memory system according to claim 1, wherein the controller controls the peripheral circuit such that an erase operation is performed for the target memory block after the pre-program operation is performed.

6. An operation method of a memory system that performs a pre-program operation for a target memory block, the method comprising:
   applying a check voltage to a word line included in a target memory block;
   acquiring check data from the target memory block;
   determining status information on the target memory block based on a number of fail bits included in the check data;
   deciding a program start voltage based on the status information;
   performing the pre-program operation by applying the decided program start voltage to the target memory block, and
   wherein the deciding a program start voltage comprises reducing the level of the program start voltage when the number of fail bits increases.

7. The method according to claim 6,
   wherein the applying the check voltage comprises applying a plurality of check voltages having levels different from one another to a word line included in the target memory block; and
   wherein the determining the status information comprises determining the status information based on a plurality of pieces of check data acquired by applying the plurality of check voltages.

8. The method according to claim 6, further comprising: deciding the pre-program operation to be performed when the number of fail bits is equal to or less than a preset reference number.

9. The method according to claim 6, further comprising:
   selecting a word line, to which the check voltage is to be applied to, from a plurality of word lines included in the target memory block,
   wherein the applying the check voltage comprises applying the check voltage to the selected word line.

10. The method according to claim 6, further comprising: performing an erase operation for the target memory block.

11. A nonvolatile memory device comprising:
    a memory cell array including a plurality of memory blocks;
    a voltage generation circuit configured to generate voltages to be applied to the memory cell array in response to an operation signal; and
    a control logic configured to control the voltage generation circuit such that check data is acquired by applying a check voltage to a target memory block selected from the memory blocks and program voltages are applied to the target memory block in a pre-program operation for the target memory block,
    wherein the control logic controls the voltage generation circuit such that status information is determined based on the check data and a program start voltage to be applied to the target memory block is variably applied in the pre-program operation based on the status information, wherein the controller determines the status information based on a number of fail bits included in the check data, and controls the peripheral circuit such that a level of the program start voltage is reduced and applied when the number of fail bits increases.

12. The nonvolatile memory device according to claim 11, further comprising:
a row decoder configured to transfer the check voltage and the program voltages generated in the voltage generation circuit to word lines included in the target memory block in response to a row address;
a column decoder configured to exchange data through bit lines electrically connected to the memory cell array in response to a column address; and
an input/output circuit configured to transmit/receive a command and data to/from an exterior.

13. The nonvolatile memory device according to claim 11, wherein the control logic controls the voltage generation circuit to generate a plurality of check voltages having levels different from one another, and determines the status information based on a plurality of pieces of check data acquired by applying the plurality of check voltages to the target memory block.

14. The nonvolatile memory device according to claim 11, wherein the control logic controls, when the number of fail bits is equal to or less than a preset reference number, the pre-program operation to be performed.

15. The nonvolatile memory device according to claim 11, wherein the control logic applies the check voltage to a word line selected from a plurality of word lines included in the target memory block, and determines the status information based on the check data acquired from the selected word line.

* * * * *